(12) United States Patent
Jeffrey et al.

(10) Patent No.: US 11,271,280 B2
(45) Date of Patent: Mar. 8, 2022

(54) TRANSMISSION LINE RESONATOR COUPLING

(71) Applicant: Google LLC, Mountain View, CA (US)

(72) Inventors: Evan Jeffrey, Santa Barbara, CA (US); Julian Shaw Kelly, Santa Barbara, CA (US)

(73) Assignee: Google LLC, Mountain View, CA (US)

(*) Notice: Subject to any disclaimer, the term of this patent is extended or adjusted under 35 U.S.C. 154(b) by 70 days.

(21) Appl. No.: 16/772,496

(22) PCT Filed: Dec. 15, 2017

(86) PCT No.: PCT/US2017/066759
§ 371 (c)(1),
(2) Date: Jun. 12, 2020

(87) PCT Pub. No.: WO2019/117954
PCT Pub. Date: Jun. 20, 2019

(65) Prior Publication Data
US 2020/0403289 A1 Dec. 24, 2020

(51) Int. Cl.
*H01P 7/08* (2006.01)
*G06N 10/00* (2022.01)
*H01B 12/00* (2006.01)
*G06N 99/00* (2019.01)
*H03H 7/38* (2006.01)

(52) U.S. Cl.
CPC .............. *H01P 7/08* (2013.01); *G06N 10/00* (2019.01); *G06N 99/00* (2013.01); *H01B 12/00* (2013.01); *H03H 7/38* (2013.01)

(58) Field of Classification Search
CPC .... H01P 7/08; H01P 7/082; H01P 5/00; H01P 5/02; H01P 5/022; H01P 5/028; H01P 5/026; H01P 5/12; H01P 5/16; H01B 12/00; H03H 7/38; G06N 99/00; G06N 10/00
See application file for complete search history.

(56) References Cited

FOREIGN PATENT DOCUMENTS

WO  WO 2017/044324  3/2017
WO  WO 2017/189053  11/2017

OTHER PUBLICATIONS

Office Action in Canadian Appln. No. 3085827, dated Jul. 8, 2021, 5 pages.
Palacios-Laloy et al., "Tunable resonators for quantum circuits," CoRR, Dec. 2007, arxiv.org/abs/0712.0221, 8 pages.
AU Office Action in Australian Appn. No. 2017443043, dated Nov. 23, 2020, 5 pages.
Office Action in Australian Appn. No. 2017443043, dated Aug. 16, 2021, 5 pages.

(Continued)

*Primary Examiner* — Stephen E. Jones
(74) *Attorney, Agent, or Firm* — Fish & Richardson P.C.

(57) ABSTRACT

An apparatus includes: a transmission line resonator; and multiple resonators coupled to the transmission line resonator, in which each resonator of the multiple resonators is coupled to the transmission line resonator at a different position X along a length of the transmission line resonator, and in which, for each resonator of the multiple resonators, a coupling position Y along a length of the resonator is selected such that, upon application of a source potential to the resonator, a standing wave established in the resonator is impedance and phase matched to a standing wave established in the transmission line resonator.

14 Claims, 6 Drawing Sheets

(56) References Cited

OTHER PUBLICATIONS

Office Action in Australian Appn. No. 2017443043, dated Sep. 23, 2021, 4 pages.
Neill et al., "A blueprint for demonstrating quantum supremacy with superconducting qubits," https://arxiv.org/abs/1709.06678, Sep. 2017, 22 pages.
PCT International Preliminary Report on Patentability in International Appln. No. PCT/US2017/066759, dated Jun. 25, 2020, 8 pages.
PCT International Search Report and Written Opinion in International Appln. No. PCT/US2017/066759, dated Oct. 10, 2018, 15 pages.
Reuther et al., "wo-resonator circuit quantum electrodynamics: Dissipative theory," Physical Review B, American Physical Society, Apr. 2010, 81(14): 144510-1-144510-16.

TRANSMISSION LINE RESONATOR COUPLING

CROSS-REFERENCE TO RELATED APPLICATION

This application is a National Stage Application under 35 U.S.C. § 371 and claims the benefit of International Application No. PCT/US2017/066759, filed Dec. 15, 2017. The disclosure of the foregoing application is hereby incorporated by reference in its entirety.

TECHNICAL FIELD

This invention relates to transmission line resonator coupling.

BACKGROUND

Quantum computing is a relatively new computing method that takes advantage of quantum effects, such as superposition of basis states and entanglement to perform certain computations more efficiently than a classical digital computer. In contrast to a digital computer, which stores and manipulates information in the form of bits (e.g., a "1" or "0"), quantum computing systems can manipulate information using qubits. A qubit can refer to a quantum device that enables the superposition of multiple states (e.g., data in both the "0" and "1" state) and/or to the superposition of data, itself, in the multiple states. In accordance with conventional terminology, the superposition of a "0" and "1" state in a quantum system may be represented, e.g., as a $\alpha|0\rangle + \beta|1\rangle$. The "0" and "1" states of a digital computer are analogous to the $|0\rangle$ and $|1\rangle$ basis states, respectively of a qubit. The value $|\alpha|^2$ represents the probability that a qubit is in $|0\rangle$ state, whereas the value $|\beta|^2$ represents the probability that a qubit is in the $|1\rangle$ basis state.

SUMMARY

In general, in some aspects, the subject matter of the present disclosure covers apparatuses including: a transmission line resonator; and multiple resonators coupled to the transmission line resonator, in which each resonator of the multiple resonators is coupled to the transmission line resonator at a different position X along a length of the transmission line resonator, and in which, for each resonator of the multiple resonators, a coupling position Y along a length of the resonator is selected such that, upon application of a source potential to the resonator, a standing wave established in the resonator is impedance and phase matched to a standing wave established in the transmission line resonator.

Implementations of the apparatuses may include one or more of the following features. For example, in some implementations, the transmission line resonator and each resonator of the multiple resonators are composed of a superconductor material. An overall length, L, of the transmission line resonator may be the same or approximately the same as an overall length of each resonator of the multiple resonators, and for each resonator of the multiple resonators, the coupling position Y along the resonator is equal to or approximately equal to the coupling position X along the transmission line resonator. For each resonator of the multiple resonators, the locations of a short circuit end and an open circuit end of the resonator may be inverted relative to the positions of a short circuit end and an open circuit end, respectively, of the transmission line resonator.

In some implementations, the transmission line resonator is a Purcell filter.

In some implementations, the transmission line resonator is a qubit bus resonator.

In some implementations, each resonator of the multiple resonators is a qubit readout resonator.

In some implementations, the apparatuses include multiple qubits, in which each resonator of the multiple resonators is couplable to a different corresponding qubit of the plurality of qubits.

In some implementations, the transmission line resonator includes a co-planar waveguide resonator.

In some implementations, the transmission line resonator has a shorted end.

In some implementations, the transmission line resonator has an open end.

In some implementations, the transmission line resonator includes a strip-line resonator.

In some implementations, the transmission line resonator is straight between a short circuit end and an open end of the transmission line resonator.

In some implementations, a length of the transmission line resonator extends between a short circuit end and an open end of the transmission line resonator.

In some implementations, the transmission line resonator is a $\lambda/4$ resonator and each resonator of the multiple resonators is a $\lambda/4$ resonator.

These and other aspects and implementations may have one or more of the following advantages. For example, in some implementations, the devices and techniques disclosed herein allow an increase in coupling efficiency between distributed resonators, where, e.g., any two resonators having the same coupler size can be coupled at any point along their geometry to achieve the same coupling strength. The resonator coupling designs disclosed herein may be used in quantum computing systems to allow more efficient coupling between qubit readout resonators and transmission line resonators, such as readout filters and/or qubit coupling bus resonators. In some implementations, the coupling designs disclosed herein mitigate the need to vary qubit readout resonator sizes in order to compensate for differences in current flow at different points along the transmission line resonator. Rather, each qubit readout resonator coupled to a common transmission line resonator may be designed to have the same size (e.g., length). In this way, design of a quantum computing system may be simplified since a single qubit readout resonator layout can be easily reproduced or "tiled" across a substrate.

For the purposes of this disclosure, a superconductor (alternatively, superconducting) material may be understood as a material that exhibits superconducting properties at or below a superconducting critical temperature. Examples of superconductor material include, but are not limited to, aluminum (superconducting critical temperature of, e.g., 1.2 kelvin), niobium (superconducting critical temperature of, e.g., 9.3 kelvin) and titanium nitride (superconducting critical temperature of, e.g., 5.6 kelvin).

The subject matter of the present disclosure relates to a transmission line resonator architecture for efficiently coupling between distributed-parameter resonators, e.g., a plurality of discrete resonators which are spaced apart, in which each discrete resonator has capacitance, inductance, and resistance that cannot be isolated into separate lumped capacitors, inductors, or resistors.

The details of one or more embodiments are set forth in the accompanying drawings and the description below. Other features and advantages will be apparent from the description, drawings, and claims.

DETAILED DESCRIPTION

The subject matter of the present disclosure relates to a transmission line resonator architecture for efficiently coupling between distributed resonators. More specifically, the subject matter of the present disclosure relates to a coupling architecture for use in quantum computing systems that allows multiple resonators, such as qubit readout resonators, to be efficiently coupled to a single common transmission line resonator. Each of the multiple resonators is positioned relative to the common transmission line resonator such that, upon application of a driving voltage to the resonator, a standing wave established in the resonator is phase and impedance matched to a standing wave established in the common transmission line resonator.

In quantum computing systems that rely on superconducting qubits, readout of a qubit often is performed using a resonator (also referred to as a "readout" resonator), such as a co-planar waveguide resonator formed from a superconductor material. Readout may be accomplished using the dispersive interaction between the qubit and the readout resonator. For example, a probe tone may be generated and supplied to the readout resonator, after which a frequency of the readout device is sampled in order to measure a phase shift, where the phase depends on the state/frequency of the superconductor qubit. In some cases, the readout resonator is protected at its output by a frequency filter such as, e.g., a Purcell bandpass filter. Generally, the filter impedes the propagation of a photon emitted from the qubit at the qubit frequency, compared with the propagation of a microwave field at the readout resonator frequency, and thus prevents energy leakage of a qubit through unwanted decay channels.

Figure 1:
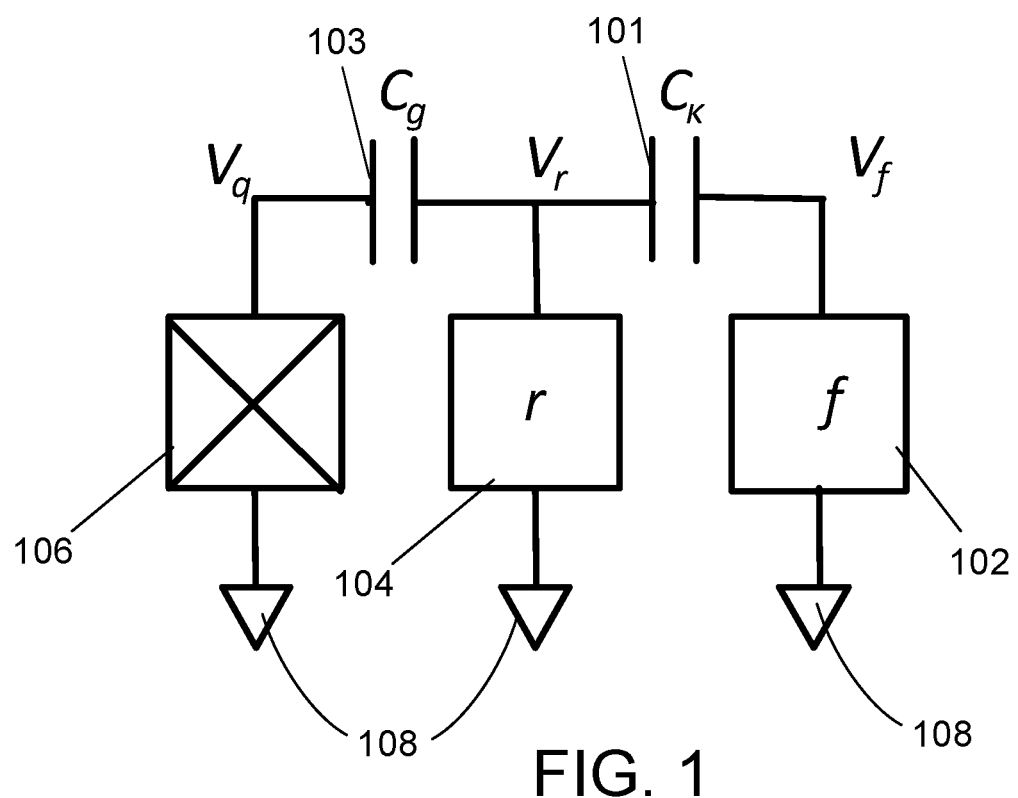
FIG. 1 is a lumped element schematic illustrating an example arrangement of a bandpass filter with a readout resonator and a qubit.

FIG. 1 is a lumped element schematic illustrating an example arrangement of a bandpass filter 102 with a readout resonator 104 and a qubit 106. The qubit's readout resonator 104 may be coupled in parallel to the filter 102 through a capacitance $C_\kappa$ (101) and the qubit may be connected to the resonator 104 by a capacitance $C_g$ (103). Alternatively, the couplings between the filter and qubit and resonator may be inductive. As shown in FIG. 1, qubit 106, resonator 104 and filter 102 are each coupled to ground 108, and the voltages across the qubit 106, resonator 104 and filter 102 are $V_q$, $V_r$, and $V_f$, respectively.

Figure 2A:
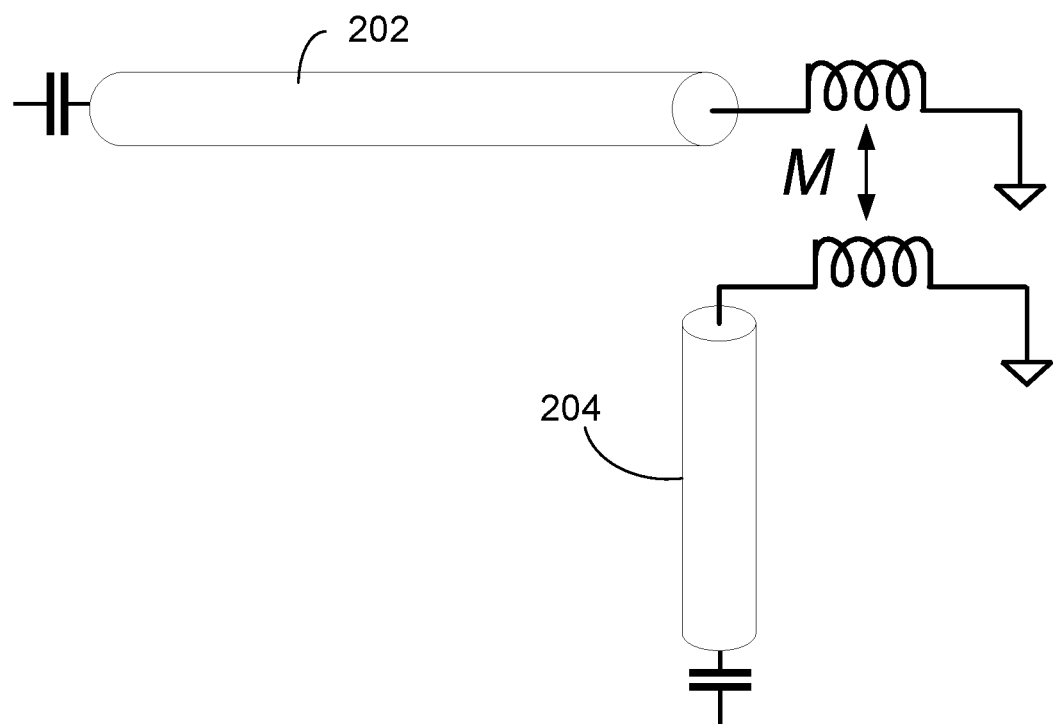
FIGS. 2A and 2B are schematics that illustrate examples of inductive coupling and capacitive coupling, respectively, between a qubit readout resonator and a transmission line resonator.
Figure 2B:
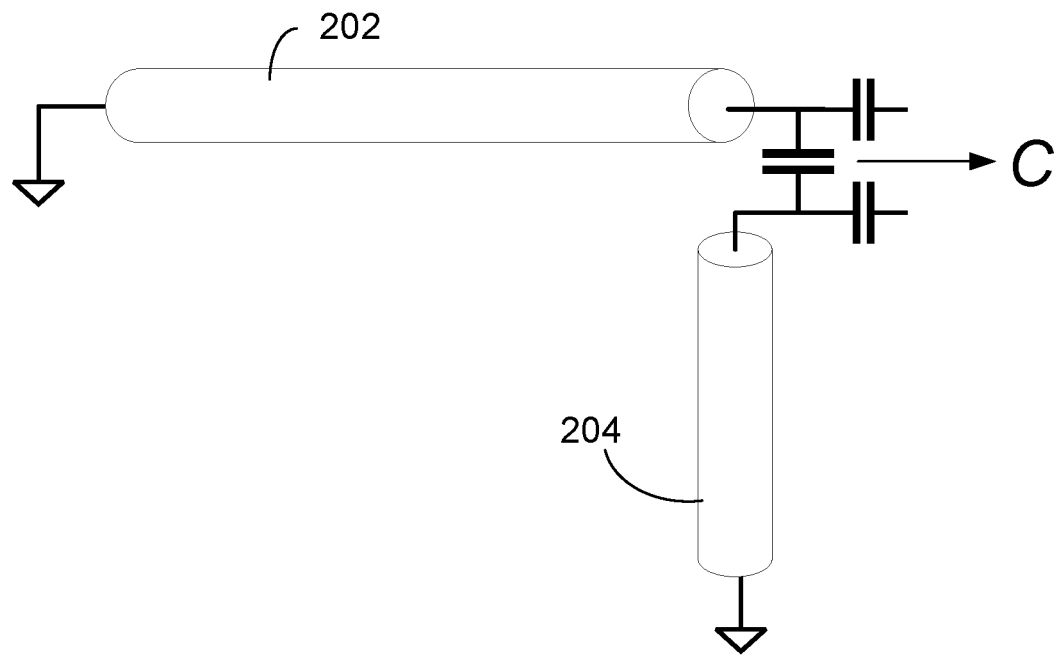

The filter may be implemented as a transmission line resonator, e.g., a quarter-wave ($\lambda/4$) or half-wave ($\lambda/2$) superconductor coplanar waveguide resonator. FIGS. 2A and 2B are schematics that illustrate examples of inductive coupling and capacitive coupling, respectively, between a qubit readout resonator and a transmission line resonator. For inductive coupling between the qubit readout resonator and the filter, as shown in FIG. 2A, the electrically shorted end of the filter 202 may be inductively coupled to the electrically shorted end of the qubit readout resonator 204 to generate a mutual inductance M. Alternatively, for capacitive coupling, the open end of the filter 202 is capacitively coupled to the open end of the qubit readout resonator 204 to generate a mutual capacitance C.

Figure 3:
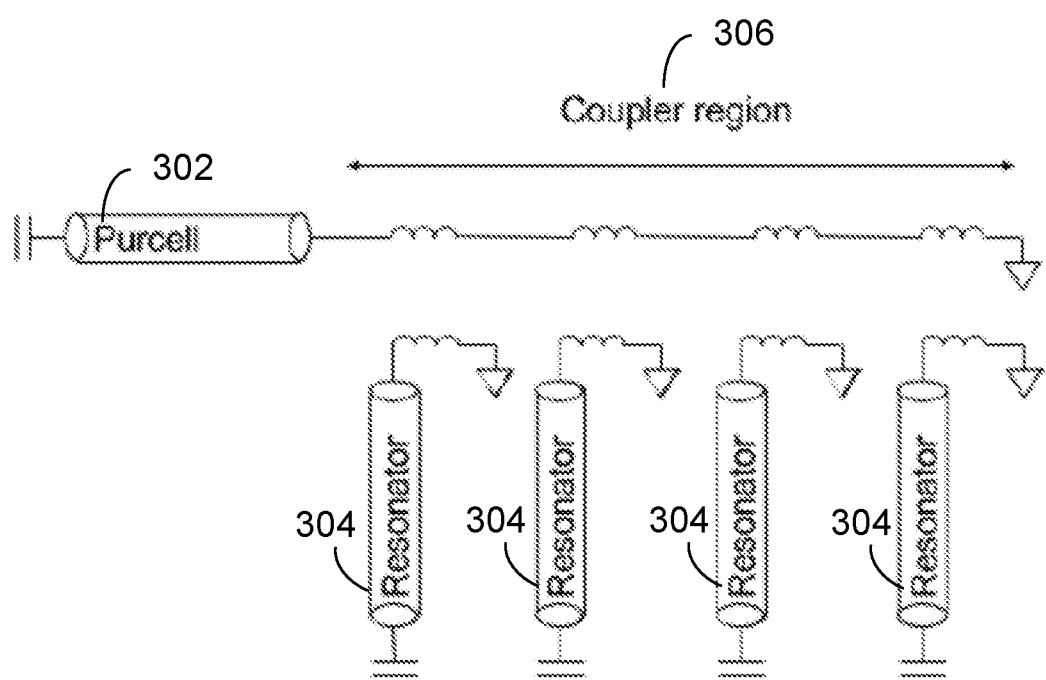
FIG. 3 is a schematic that illustrates an example of a configuration in which multiple qubit readout resonators are coupled to a single transmission line filter.

Rather than provide one filter for each readout resonator, as shown in FIGS. 2A-2B, it is possible to use a single filter to which multiple readout resonators couple. FIG. 3 is a schematic that illustrates an example of this configuration in which multiple qubit readout resonators 304 are coupled to a single transmission line filter 302 serving as a Purcell filter. By providing a single filter for use with multiple readout resonators, space that would have otherwise been used by filters may be made available for other quantum computing components, such as additional qubits. This may be accomplished by coupling each qubit readout resonator to a coupling region 306 located at either the shorted end or the open end of the filter. However, due to the finite length of the coupling region and the distribution of current along the length of the transmission line resonator that forms the filter, portions of the filter transmission line resonator having the same geometric inductance (or same geometric capacitance) do not provide the same coupling strength, resulting in inefficient coupling between the transmission line resonator and the qubit readout resonators. This, in turn, results in different quality factors Q among the multiple qubit readout resonators. While the length of the coupling segment of each qubit readout resonator can be varied to compensate for this effect, such variation in length alters the inductance of the qubit readout resonator, which, in certain cases, may not be desirable. For instance, qubit readout resonator frequencies are typically separated from one another in frequency space by a fixed amount (e.g., 30 MHz) that is known within a specified accuracy of the transmission line resonator frequency (e.g., 1% of 4.5 GHz). However, if each qubit readout resonator has a different coupler inductance, it may be difficult to compensate for the different resonator coupling inductances within the specified accuracy level. Furthermore, when the length of the coupling region is increased, it occupies a greater footprint on the chip substrate, such that reproducing or "tiling" the qubit readout resonator design becomes more complicated.

These technical problems associated with coupling multiple qubit readout resonators to a transmission line resonator may be ameliorated by the present efficient coupling architecture, which uses the entire transmission line resonator for coupling to the readout resonators instead of just the shorted or open ends of the transmission line resonator. More specifically, the readout resonators are arranged along the transmission line resonator such that a standing wave profile established in each readout resonator is matched (e.g., impedance-matched and phase-matched) to the standing wave profile in the filter transmission line resonator.

Figure 4:
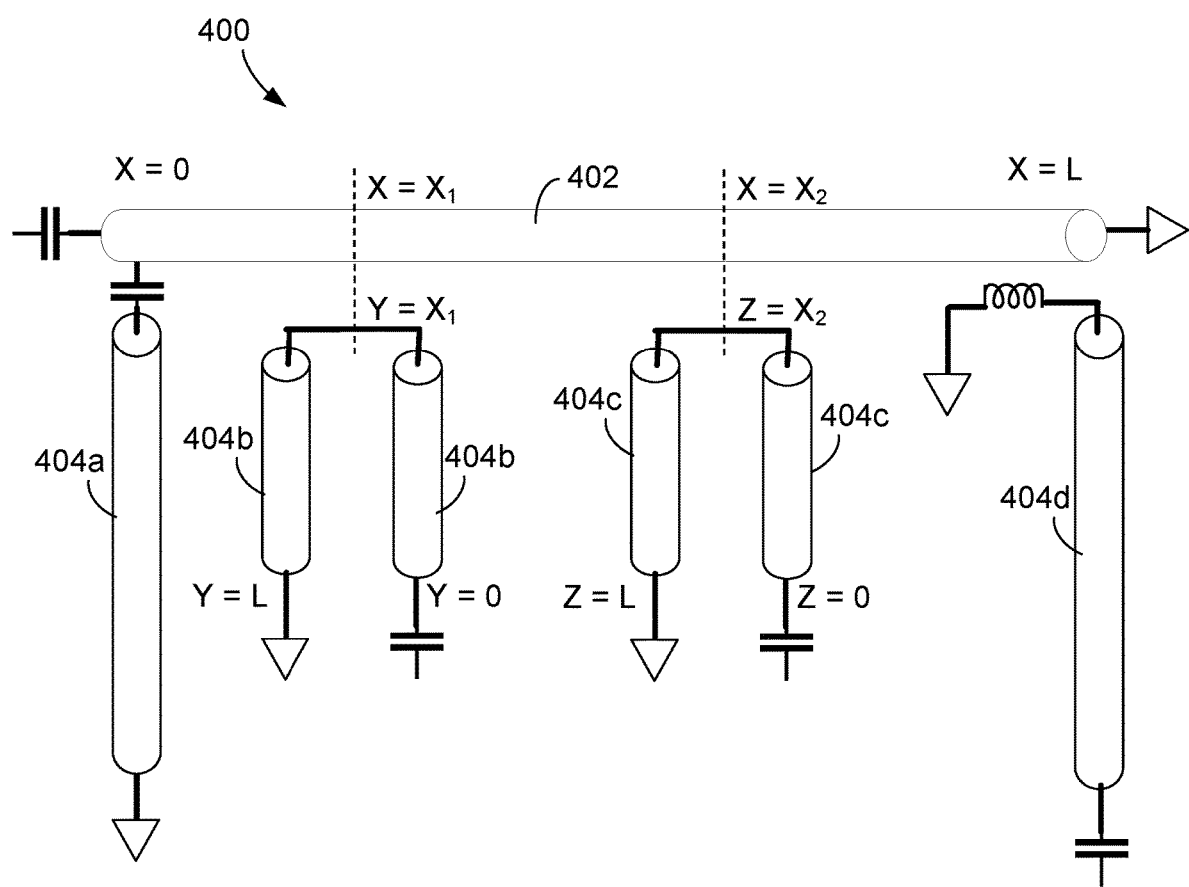
FIG. 4 is a schematic that illustrates an example of a coupling architecture for coupling multiple qubit readout resonators along an entire length of a common transmission line resonator.

FIG. 4 is a schematic that illustrates an example of a coupling architecture 400 for coupling multiple qubit readout resonators along an entire length of a common transmission line resonator (the entire length being between two opposing ends of the common transmission line resonator) instead of just the shorted or open ends of the transmission line resonator. As shown in FIG. 4, a transmission line resonator 400 is provided. The transmission line resonator 400 may include, e.g., a filter such as a Purcell filter. In some implementations, the transmission line resonator 400 is fabricated as a co-planar waveguide resonator or as a stripline resonator, though other resonator designs also are possible. The resonator may be formed from a superconductor material, such as aluminum, niobium, or titanium nitride, among other superconductor materials. Multiple resonators 404a, 404b, 404c, 404d are positioned adjacent to the transmission line resonator 400 so that the resonators 404a, 404b, 404c, 404d can effectively couple (e.g., through a non-negligible shared inductance and capacitance) to the transmission line resonator 400. In particular, a first resonator 404a is coupled to a first end of the transmission line resonator 402, a second resonator 404d is coupled to a second end of the transmission line resonator 402 (where the second end is opposite to the first end), and a third resonator 404b and a fourth resonator 404c are coupled to intermediate regions along the transmission line resonator 402.

Each of the resonators 404a, 404b, 404c, 404d may include, e.g., a qubit readout resonator, to which a corresponding qubit can couple. For ease of viewing, the qubits are omitted from FIG. 4. Like the transmission line resonator 402, the readout resonators 404a, 404b, 404c, 404d also may be fabricated as a co-planar waveguide resonator, strip-line resonator or other resonator, and may be formed from a superconductor material. As shown in FIG. 4, each of the transmission line resonator 402 and the readout resonators 404a, 404b, 404c, 404d includes a shorted end coupled to a common ground and an opposite open end (represented by a capacitor symbol).

In the present example, each readout resonator 404 is associated with a resonant frequency that is approximately the same as the resonant frequency associated with the transmission line resonator 402. For instance, each readout resonator 404 may be associated with a resonant frequency that is within 10% or less, 5% or less, 2% or less, 1% or less, or 0.5% or less of the resonant frequency associated with the transmission line resonator 402. The resonant frequencies may be, e.g., in the range of about 3 GHz to about 10 GHz. An exemplary configuration would include a Purcell filter associated with a resonant frequency of 5 GHz, with five different readout resonators, each associated with a resonant frequency at 4.90 GHz, 4.95 GHz, 5.0 GHz, 5.05 GHz, and 5.1 GHz. In the case that the readout resonator 404 and the transmission line resonator 402 are, e.g., co-planar waveguide resonators, having approximately the same resonant frequency would mean that, for a fixed resonator thickness and width, both the transmission line resonator 402 and each readout resonator 404 would have approximately the same overall length (the length between the two opposing ends of the resonator that are shorted or open). Thus, for the coupling configuration shown in FIG. 4 in which transmission line resonator 402 has an overall length L, each of the qubit readout resonators 404 also will have an overall length of approximately L.

For a specific location, X, along the filter transmission line resonator 402 to which a qubit readout resonator 404 couples, the corresponding coupling location, Y, along the qubit readout resonator 404 is selected such that a standing wave profile established in the qubit readout resonator 404 is matched to the standing wave profile in the transmission line resonator 402. That is, the standing wave profile of the qubit readout resonator 404 is both impedance and phase matched to the standing wave profile of the transmission line resonator 402. Because the standing wave profile along the transmission line resonator varies as a function of length, the coupling location along each readout resonator also will vary. In certain implementations, for transmission line resonators having approximately the same frequency, the same geometrical design, and thus same overall length, as the readout resonators, this results in the coupling location along the readout resonator being established at a same position as the corresponding coupling location along the filter transmission line resonator. The transmission line resonator and qubit readout resonator therefore may couple efficiently in the intermediate region, so long as the same intermediate capacitive and inductive region in each resonator is used in the coupler.

In certain implementations, the transmission line resonator does not have the same geometrical design as the readout resonator. For example, a purcell filter may be formed from multiple geometrical designs including, e.g., a portion that is a co-planar waveguide and a portion that is a stripline, each of which has its own and different effective epsilon. Accordingly, in such implementations, the impedance and phase matching does not result in the physical distance along the filter being matched to the distance along the qubit readout resonator.

In an example shown in FIG. 4 (in which the transmission line resonator and the qubit readout resonators have the same geometrical design, and thus same overall length), to couple qubit readout resonator 404b to the transmission line resonator 402 at X1=L/3, the corresponding coupling position along qubit readout resonator 404b is located at Y=X1=L/3. Similarly, to couple qubit readout resonator 404c to the transmission line resonator 402 at X2=2L/3, the corresponding coupling position along qubit readout resonator 404c then is located at Z=X2=2L/3. The coupling of readout resonators 404a, 404d to the ends of the transmission line resonator 402 may be understood in the same way. That is, to couple readout resonators 404a, 404d to transmission line resonator 402 at X=0 and at X=L, the corresponding coupling positions along resonators 404a, 404b, respectively, also must be located at their ends. For each of the coupling arrangements shown in FIG. 4, only a portion of the qubit readout resonator at its coupling position is located adjacent to the transmission line resonator. The length of this coupling portion (the coupling length) over which a combination of capacitive and inductive coupling occurs may be obtained from numerical simulations based on the geometry of the resonators. For instance, a model of the coupling region of the resonators may be designed, and its coupling length varied while the S parameters are observed to identify the target coupling length.

Furthermore, to achieve coupling that results in constructive rather than destructive interference, the boundary conditions (e.g., whether open or short) of the transmission line resonator is inverted relative to each qubit readout resonator to which the transmission line resonator is coupled over the intermediate coupling region. That is, the position of the short circuit end (e.g., where reflection is 180 degrees) of the transmission line resonator 402 is inverted relative to the short circuit end of the qubit readout resonator 404 to which the transmission line resonator 402 is coupled. Similarly, the position of the open circuit end (e.g., where reflection is 0 degrees) of the transmission line resonator 402 is inverted relative to the open circuit end of the qubit readout resonator to which the transmission line resonator 402 is coupled. This leads to the standing wave profiles also being phase matched in addition to impedance matched. Notably, when coupling at the ends of the transmission line resonator, e.g., 404a, 404d, the orientation of the boundary condition is immaterial.

Though only four readout resonators 404 are shown coupling to transmission line resonator 402, the coupling technique disclosed herein can be used to couple other numbers of qubit readout resonators to a common transmission line. For example, the techniques disclosed herein may be used to couple, e.g., 2, 3, 5, 6, 8, 10, 12, 15, 20, or more qubit readout resonators to a common transmission line resonator.

Figure 5:
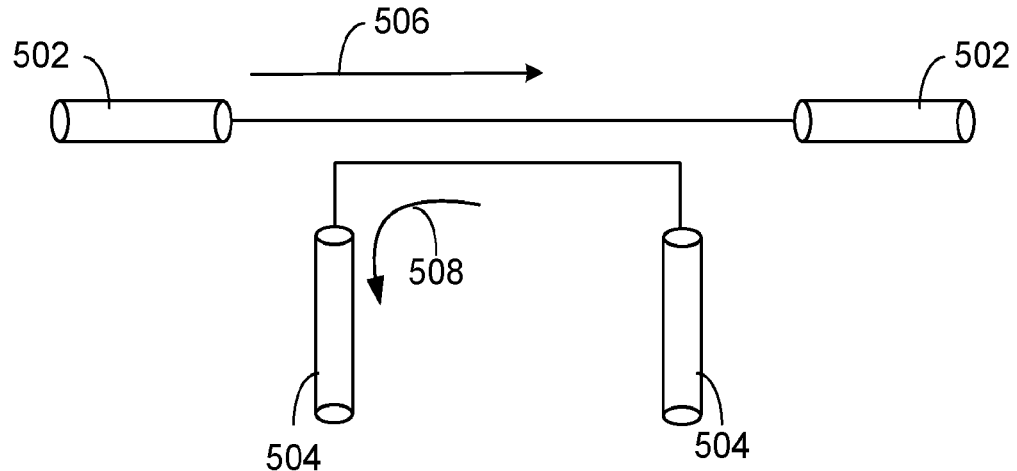
FIG. 5 is a schematic that illustrates a simplified 4-port system where two transmission line resonators are brought close together as to have non-negligible shared inductance and capacitance.
Figure 6:
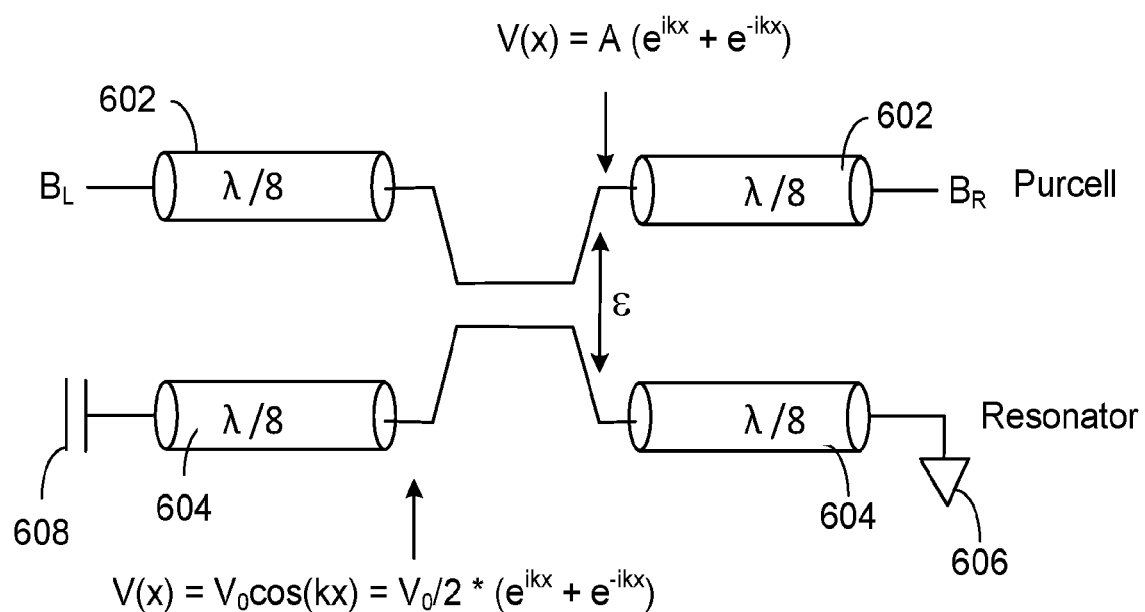
FIG. 6 is a schematic that illustrates an example in which two coupled $\lambda/4$ resonators are coupled in the middle of an intermediate capacitive and inductive region.
Figure 7:
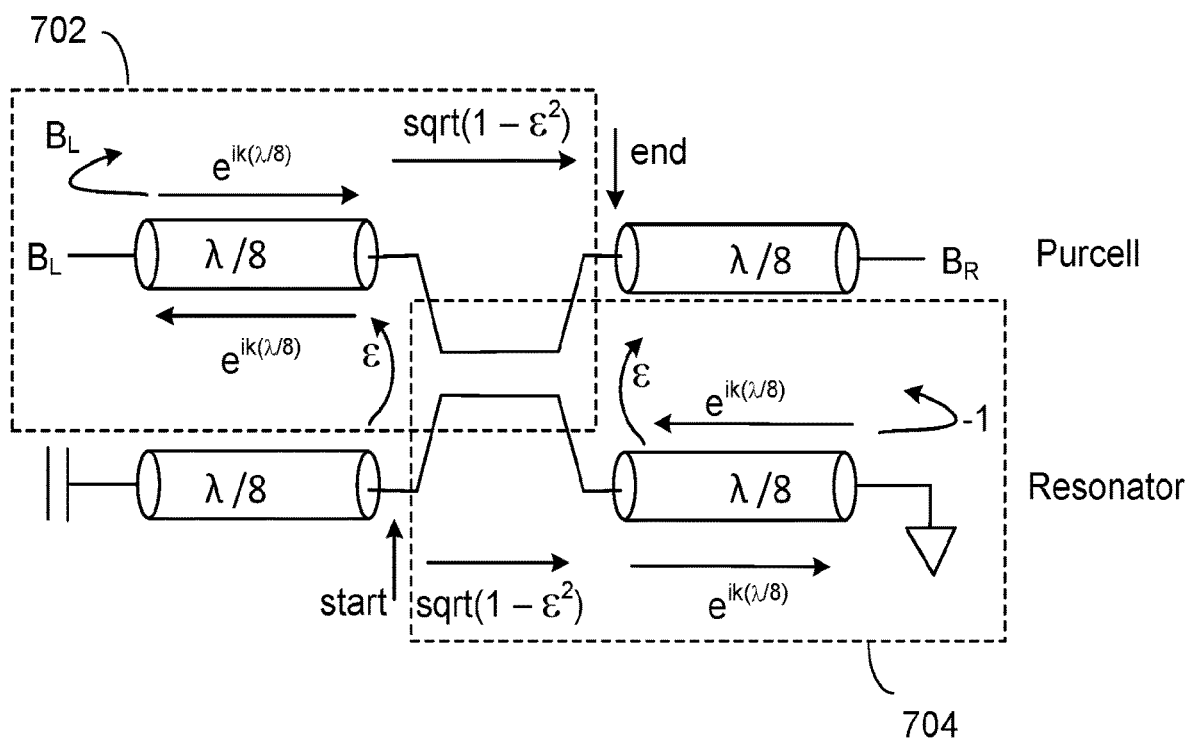
FIG. 7 is a schematic that illustrates the coupling arrangement of FIG. 6, in which traveling wave pathways are identified.

The geometrical coupling depicted in FIG. 4 is further described with respect to the coupling models shown in FIGS. 5-7. FIG. 5 is a schematic that illustrates a simplified 4 port system where two transmission line resonators 502, 504 are brought close together as to have non-negligible shared inductance and capacitance. An incident wave 506 introduced in resonator 502 and traveling from port 1 to port 2 will result in a wave 508 leaking to port 3 and travelling in the opposite direction, such that a magnitude of the S-parameter between ports 1 and 3 is positive and much greater than the magnitude of the S-parameter between ports 1 and 4, i.e., |S13|>0 and |S13|>>|S14|. The value of |S13| is set by the amount of coupling between resonator 502 and resonator 504. Note that with this model, resonant behaviors of the transmission line resonator 502 and the transmission line resonator 504 are not taken into account.

FIG. 6 is a schematic that illustrates an example of an extreme case in which two coupled $\lambda/8$ resonators 602, 604 (equivalent to a single $\lambda/4$ resonator divided in half) are coupled in the middle of the intermediate capacitive and inductive region. These resonators are coupled such that the magnitude of the S-parameter between port 1 and port 3 can be expressed as $|S13|=\varepsilon$, where epsilon is a relatively small non-zero value. The boundary conditions $B_L$ and $B_R$ associated with the first $\lambda/8$ resonator 602 are left undefined for the moment, other than $B_L=-B_R$, where the boundary condition may represent either an open or shorted resonator end. The second resonator 604 includes a first grounded end 606 and a second open end 608. The width of the coupler region (e.g., the lateral extent over which the two resonators are directly adjacent to one another such as shown in FIG. 6) is assumed to be negligible. The voltage along the first resonator 602 as a function of position x along the first resonator may be expressed as $$V(x)=A(e^{ikx}+e^{-ikx})$$

where A is the voltage amplitude induced in the first resonator 602 (e.g., a Purcell filter) given a driving voltage in the second resonator 604 (e.g., a qubit readout resonator), and k is the wave vector.

The voltage along the second resonator 604 as a function of position x along the second resonator may be expressed as $$V(x)=V_0 \cos(kx)=V_0/2(e^{ikx}+e^{-ikx})$$

To quantify the coupling between the first resonator 602 and the second resonator 604, one can solve for A. An approach to solving for A is to focus on the positive traveling wave term $e^{ikx}$, and consider only terms to first order in $\varepsilon$. This may be achieved by summing paths from the denoted region (where the start arrow is pointing) of the resonator to the Purcell filter. Open resonator ends give an amplitude factor of 1, whereas shorted resonator ends give a factor of −1 due to boundary conditions.

FIG. 7 is a schematic that illustrates the coupling arrangement of FIG. 6, but identifies the traveling wave pathways that are summed in order to solve for A. Summing over the traveling waves in sections 702 and 704 of the coupling arrangement shown in FIG. 7 can be expressed as $$A = \varepsilon B_L \sqrt{(1-\varepsilon^2)}\, e^{ik\frac{\lambda}{4}} - \varepsilon\sqrt{(1-\varepsilon^2)}\, e^{ik\frac{\lambda}{4}}$$

To obtain a nonzero value of A, $B_L=-1$, meaning that $B_L$ is the short end of the resonator, and $B_R$ is the open end of the resonator. Under this condition, and taking $\varepsilon^2=0$, A can be expressed as $$A=2i\varepsilon.$$

This may be understood to mean that a voltage in the Purcell filter is proportional to the coupling $\varepsilon$, and 90 degrees out of phase. Notably, the foregoing analysis indicates that the boundary conditions of the first resonator 602 (e.g., a Purcell filter) should be inverted with respect to the second resonator 604 (e.g., qubit readout resonator) in order to achieve constructive rather than destructive interference of the traveling waves. This constructive comes about because the coupler changes the direction of the propagating wave, where |S13|>0 and |S13|>>|S14|. Thus, two resonators may be efficiently coupled at any point along their overall length so long the standing wave across each resonator is matched, and the boundary conditions for one of the resonators is inverted with respect to the other resonator.

The present efficient coupling architecture may also be applied to qubit bus resonator networks. For example, multiple qubits may be efficiently coupled to a common bus line resonator using the same design principles. As an example, a common bus line resonator may be coupled to n qubit-resonator pairs (QRn), where n≥2. A qubit-resonator pair includes, e.g., a qubit, such as a superconducting qubit and a corresponding resonator to which the qubit can couple. The resonator may include, e.g., a co-planar waveguide resonator, a stripline resonator, or a microstrip resonator, among other resonator designs. A coupling location along each resonator of each qubit-resonator pair is selected such that a standing wave established in the resonator is impedance and phase matched to a standing wave in the bus resonator using the same design approach described herein.

In some implementations disclosed herein, the qubit readout resonators and/or the transmission line resonators are presented as $\lambda/4$ resonators. However, other resonator designs also are possible. For example, in some implementations, the transmission line resonator can include a $\lambda/2$ resonator. Alternatively, or in addition, the qubit readout resonators can include $\lambda/2$ resonators. In various implementations, the standing waves established in the transmission line resonator and qubit readout resonators may include the fundamental mode or higher order modes.

In some implementations disclosed herein, the qubit readout resonators and the transmission line resonator are described as having the same overall physical length such that impedance and phase matching occurs at the same position along each of the transmission line resonator and the qubit readout resonator. However, in some implementations, the transmission line resonator and the qubit readout resonators may have different geometrical designs (e.g., co-planar waveguide versus stripline waveguide) and/or different effective epsilon. Efficient coupling in the intermediate region may still be obtained by matching the impedance and phase of the standing waves in both the transmission line resonator and in the qubit readout resonators.

Implementations of the quantum subject matter and quantum operations described in this specification can be implemented in suitable quantum circuitry or, more generally, quantum computational systems, including the structures disclosed in this specification and their structural equivalents, or in combinations of one or more of them. The term "quantum computational systems" may include, but is not limited to, quantum computers, quantum information processing systems, quantum cryptography systems, topological quantum computers, or quantum simulators.

The terms quantum information and quantum data refer to information or data that is carried by, held or stored in quantum systems, where the smallest non-trivial system is a qubit, e.g., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In some implementations the computational basis states are identified with the ground and first excited states, however it is understood that other setups where the computational states are identified with higher level excited states are possible. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Quantum circuit elements (also referred to as quantum computing circuit elements) include circuit elements for performing quantum processing operations. That is, the quantum circuit elements are configured to make use of quantum-mechanical phenomena, such as superposition and entanglement, to perform operations on data in a non-deterministic manner. Certain quantum circuit elements, such as qubits, can be configured to represent and operate on information in more than one state simultaneously. Examples of superconducting quantum circuit elements include circuit elements such as quantum LC oscillators, qubits (e.g., flux qubits, phase qubits, or charge qubits), and superconducting quantum interference devices (SQUIDS) (e.g., RF-SQUID or DC-SQUID), among others.

In contrast, classical circuit elements generally process data in a deterministic manner. Classical circuit elements can be configured to collectively carry out instructions of a computer program by performing basic arithmetical, logical, and/or input/output operations on data, in which the data is represented in analog or digital form. In some implementations, classical circuit elements can be used to transmit data to and/or receive data from the quantum circuit elements through electrical or electromagnetic connections. Examples of classical circuit elements include circuit elements based on CMOS circuitry, rapid single flux quantum (RSFQ) devices, reciprocal quantum logic (RQL) devices and ERSFQ devices, which are an energy-efficient version of RSFQ that does not use bias resistors.

Fabrication of the circuit elements described herein can entail the deposition of one or more materials, such as superconductors, dielectrics and/or metals. Depending on the selected material, these materials can be deposited using deposition processes such as chemical vapor deposition, physical vapor deposition (e.g., evaporation or sputtering), or epitaxial techniques, among other deposition processes. Processes for fabricating circuit elements described herein can entail the removal of one or more materials from a device during fabrication. Depending on the material to be removed, the removal process can include, e.g., wet etching techniques, dry etching techniques, or lift-off processes. The materials forming the circuit elements described herein can be patterned using known lithographic techniques (e.g., photolithography or e-beam lithography).

During operation of a quantum computational system that uses superconducting quantum circuit elements and/or superconducting classical circuit elements, such as the circuit elements described herein, the superconducting circuit elements are cooled down within a cryostat to temperatures that allow a superconductor material to exhibit superconducting properties. A superconductor (alternatively superconducting) material can be understood as material that exhibits superconducting properties at or below a superconducting critical temperature. Examples of superconducting material include aluminum (superconductive critical temperature of 1.2 kelvin) and niobium (superconducting critical temperature of 9.3 kelvin). Accordingly, superconducting structures, such as superconducting traces and superconducting ground planes, are formed from material that exhibits superconducting properties at or below a superconducting critical temperature.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. For example, the actions recited in the claims can be performed in a different order and still achieve desirable results. In certain circumstances, multitasking and parallel processing may be advantageous. Moreover, the separation of various components in the implementations described above should not be understood as requiring such separation in all implementations.

A number of implementations have been described. Nevertheless, it will be understood that various modifications may be made without departing from the spirit and scope of the invention. For instance, various examples are described herein using Purcell filters. However, other filters, such as low pass filters, high pass filters, stepped impedance filters, among other types of filters may be used instead. Other implementations are within the scope of the following claims.

What is claimed is:

1. An apparatus comprising:
    a transmission line resonator; and
    a plurality of resonators coupled to the transmission line resonator,
    wherein each resonator of the plurality of resonators is coupled to the transmission line resonator at a different position X along a length of the transmission line resonator, and
    wherein, for each resonator of the plurality of resonators, a coupling position Y along a length of the resonator is selected such that, upon application of a source potential to the resonator, a standing wave established in the resonator is impedance and phase matched to a standing wave established in the transmission line resonator.

2. The apparatus of claim 1, wherein the transmission line resonator comprises a co-planar waveguide resonator.

3. The apparatus of claim 1, wherein the transmission line resonator has a short circuit end.

4. The apparatus of claim 1, wherein the transmission line resonator has an open circuit end.

5. The apparatus of claim 1, wherein the transmission line resonator comprises a strip-line resonator.

6. The apparatus of claim 1, wherein the transmission line resonator is straight between a short circuit end and an open end of the transmission line resonator.

7. The apparatus of claim 1, wherein the transmission line resonator is a $\lambda/4$ resonator and each resonator of the plurality of resonators is a $\lambda/4$ resonator.

8. The apparatus of claim 1, wherein the transmission line resonator and each resonator of the plurality of resonators are composed of a superconductor material.

9. The apparatus of claim 8, wherein an overall length, L, of the transmission line resonator is the same or approximately the same as an overall length of each resonator of the plurality of resonators, and
    wherein, for each resonator of the plurality of resonators, the coupling position Y along the resonator is equal to or approximately equal to the coupling position X along the transmission line resonator.

10. The apparatus of claim 8, wherein, for each resonator of the plurality of resonators, locations of a short circuit end and an open circuit end of the resonator are inverted relative to positions of a short circuit end and an open circuit end, respectively, of the transmission line resonator.

11. The apparatus of claim 8, wherein the transmission line resonator is a Purcell filter.

12. The apparatus of claim 8, wherein the transmission line resonator is a qubit bus resonator.

13. The apparatus of claim 8, wherein each resonator of the plurality of resonators is a qubit readout resonator.

14. The apparatus of claim 8, further comprising a plurality of qubits, wherein each resonator of the plurality of resonators is couplable to a different corresponding qubit of the plurality of qubits.

* * * * *